United States Patent
Lee et al.

(10) Patent No.: US 7,855,395 B2
(45) Date of Patent: Dec. 21, 2010

(54) LIGHT EMITTING DIODE PACKAGE HAVING MULTIPLE MOLDING RESINS ON A LIGHT EMITTING DIODE DIE

(75) Inventors: Chung-Hoon Lee, Gyeonggi-Do (KR); Do-Hyung Kim, Suwon-si (KR); Keon-Young Lee, Ansan-Si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 0 days.

(21) Appl. No.: 11/575,128

(22) PCT Filed: Jun. 23, 2005

(86) PCT No.: PCT/KR2005/001946

§ 371 (c)(1),
(2), (4) Date: Oct. 15, 2007

(87) PCT Pub. No.: WO2006/059828

PCT Pub. Date: Jun. 8, 2006

(65) Prior Publication Data

US 2008/0023721 A1      Jan. 31, 2008

(30) Foreign Application Priority Data

| Sep. 10, 2004 | (KR) | .................. | 10-2004-0072452 |
| Oct. 7, 2004  | (KR) | .................. | 10-2004-0079909 |
| Jan. 3, 2005  | (KR) | .................. | 10-2005-0000269 |

(51) Int. Cl.
*H01L 33/00* (2010.01)
*H01L 23/495* (2010.01)
*H01L 23/34* (2010.01)

(52) U.S. Cl. .................. 257/99; 257/98; 257/100; 257/675; 257/676; 257/712; 257/E33.058; 257/E33.059

(58) Field of Classification Search ............ 257/99, 257/81, 100, E33.059, 98, 675, 712, 676, 257/E33.058
See application file for complete search history.

(56) References Cited

U.S. PATENT DOCUMENTS 5,177,669 A    1/1993   Juskey (Continued)

FOREIGN PATENT DOCUMENTS

CN        1380704        11/2002

(Continued)

OTHER PUBLICATIONS

Office Action dated Jun. 2, 2009 (for co-pending U.S. Appl. No. 12/196,028).

(Continued)

*Primary Examiner*—Phat X Cao
*Assistant Examiner*—Diana C Garrity
(74) *Attorney, Agent, or Firm*—H.C. Park & Associates, PLC

(57) ABSTRACT

Disclosed is a light emitting diode (LED) package having multiple molding resins. The LED package includes a pair of lead terminals. At least portions of the pair of lead terminals are embedded in a package main body. The package main body has an opening through which the pair of lead terminals is exposed. An LED die is mounted in the opening and electrically connected to the pair of lead terminals. A first molding resin covers the LED die. A second molding resin with higher hardness than the first molding resin covers the first molding resin. Therefore, stress to be imposed on the LED die can be reduced and the deformation of the molding resins can be prevented.

19 Claims, 12 Drawing Sheets

U.S. PATENT DOCUMENTS

| | | | |
|---|---|---|---|
| 5,958,100 | A | 9/1999 | Farnworth |
| 6,274,924 | B1 | 8/2001 | Carey et al. |
| 6,517,218 | B2 | 2/2003 | Hochstein |
| 6,747,293 | B2 * | 6/2004 | Nitta et al. ............... 257/99 |
| 6,924,514 | B2 * | 8/2005 | Suenaga .................. 257/98 |
| 7,321,161 | B2 * | 1/2008 | Teixeira et al. ............ 257/675 |
| 2001/0030866 | A1 | 10/2001 | Hochstein |
| 2004/0041222 | A1 | 3/2004 | Loh |
| 2004/0227145 | A1 * | 11/2004 | Abe et al. ................. 257/98 |
| 2004/0227149 | A1 * | 11/2004 | Ibbetson et al. ............ 257/100 |
| 2005/0045901 | A1 * | 3/2005 | Wall, Jr. .................. 257/99 |
| 2005/0269587 | A1 * | 12/2005 | Loh et al. ................. 257/99 |
| 2006/0012299 | A1 | 1/2006 | Suehiro |
| 2006/0103012 | A1 | 5/2006 | Chin |

FOREIGN PATENT DOCUMENTS

| | | |
|---|---|---|
| DE | 10214119 | 10/2003 |
| EP | 1246266 | 10/2002 |
| EP | 1249874 | 10/2002 |
| EP | 1439584 | 7/2004 |
| EP | 1484802 | 12/2004 |
| JP | 7111343 | 4/1995 |
| JP | 8-335720 | 12/1996 |
| JP | 11-121809 | 4/1999 |
| JP | 11112036 | 4/1999 |
| JP | 2000-150967 | 5/2000 |
| JP | 2001-185763 | 7/2001 |
| JP | 2001223305 | 8/2001 |
| JP | 2002-252373 | 9/2002 |
| JP | 2002314139 | 10/2002 |
| JP | 2002359403 | 12/2002 |
| JP | 2004-221598 | 8/2004 |
| JP | 2004235261 | 8/2004 |
| RU | 2134000 | 7/1999 |
| WO | WO 00/55914 | 9/2000 |
| WO | WO 2004102685 A1 * | 11/2004 |
| WO | 2006006544 | 1/2006 |

OTHER PUBLICATIONS

European Search Report dated Aug. 24, 2009.

* cited by examiner

PRIOR ART
【Fig.1】
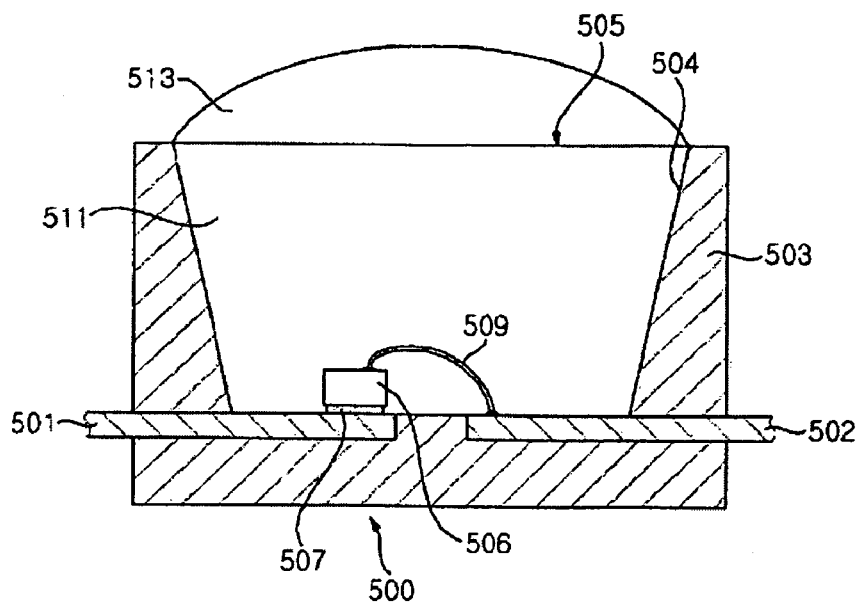
【Fig.2】
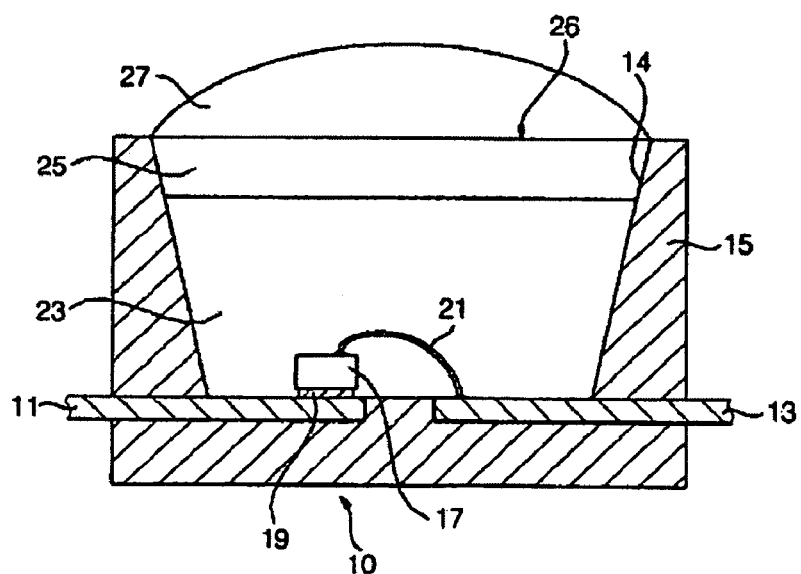

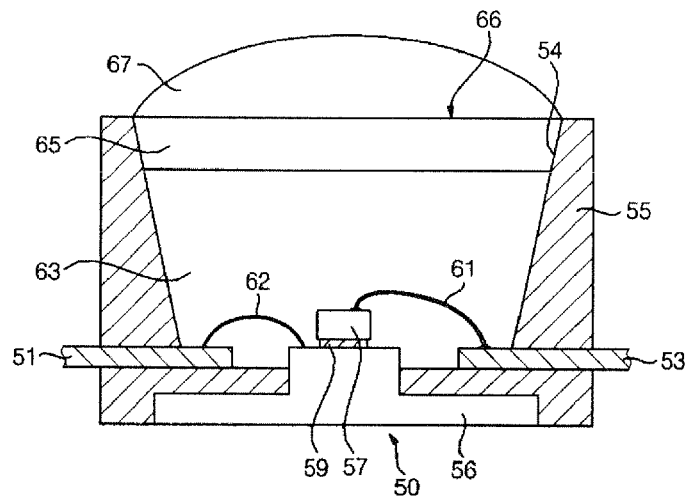
[Fig.3]
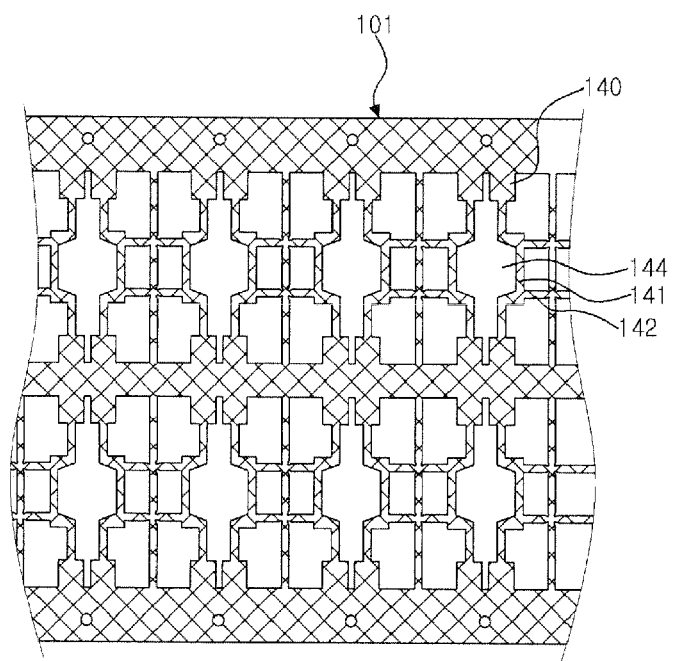
[Fig.4]

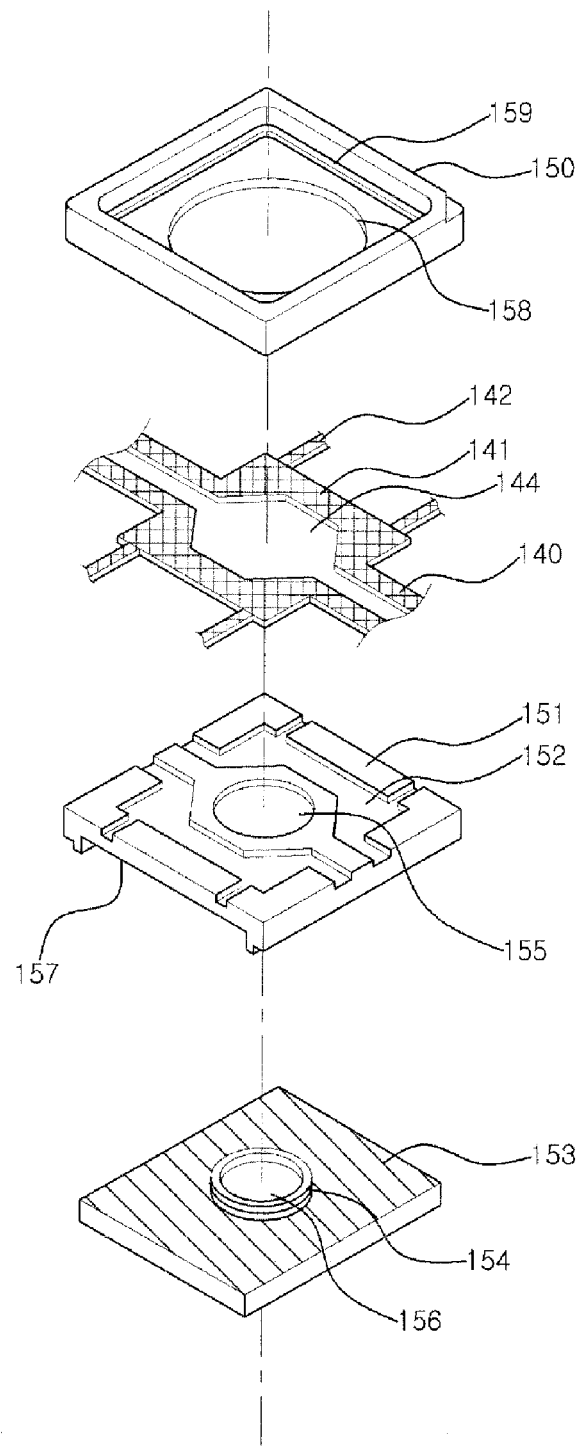
[Fig.5]

[Fig.6]
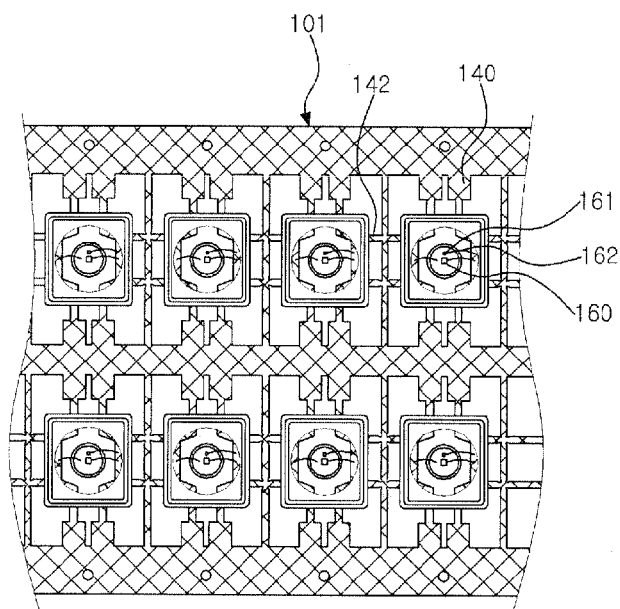
[Fig.7]
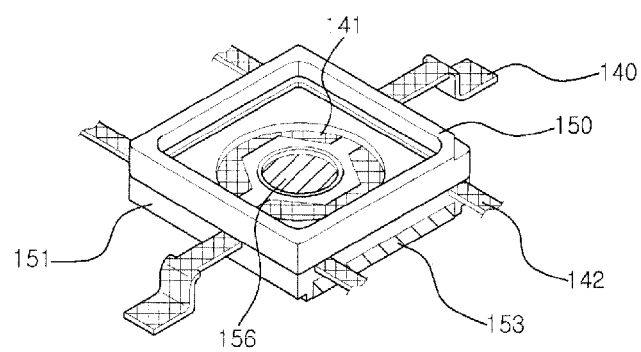
[Fig.8]
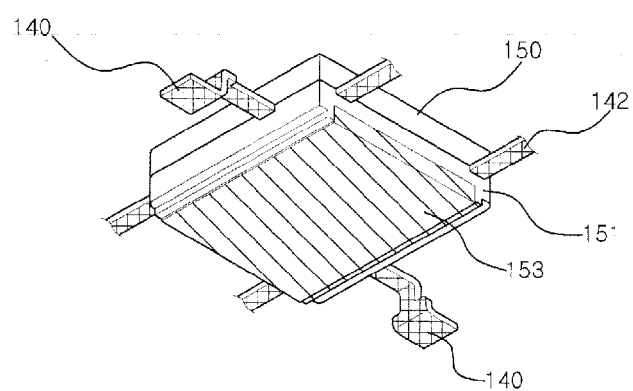

[Fig. 9]
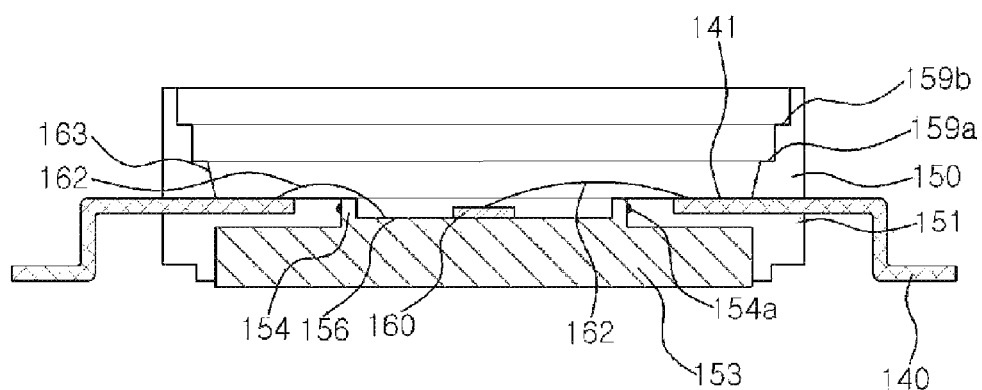
[Fig. 10]
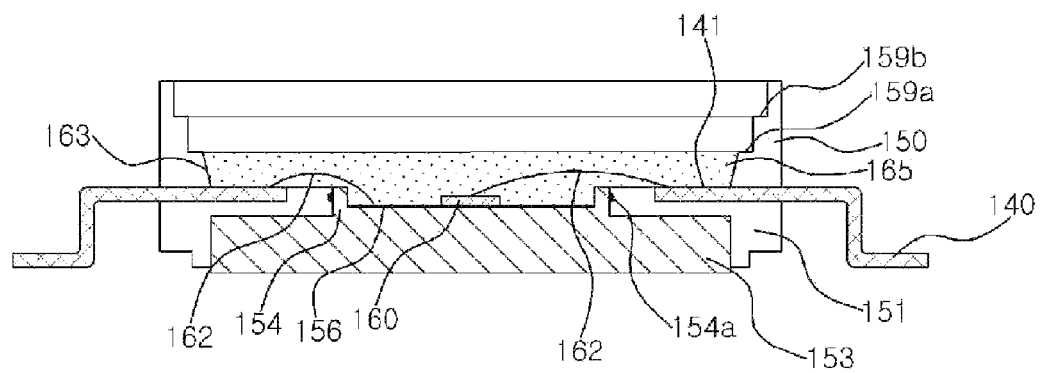
[Fig. 11]
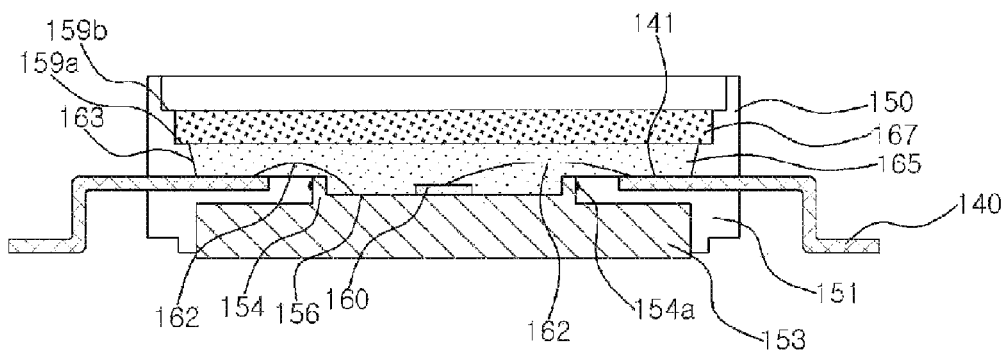

[Fig. 12]
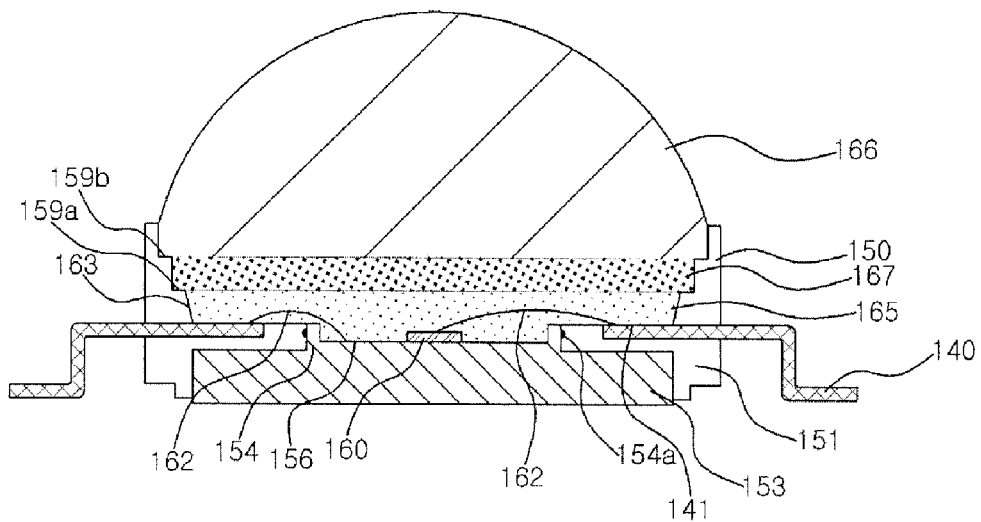
[Fig. 13]
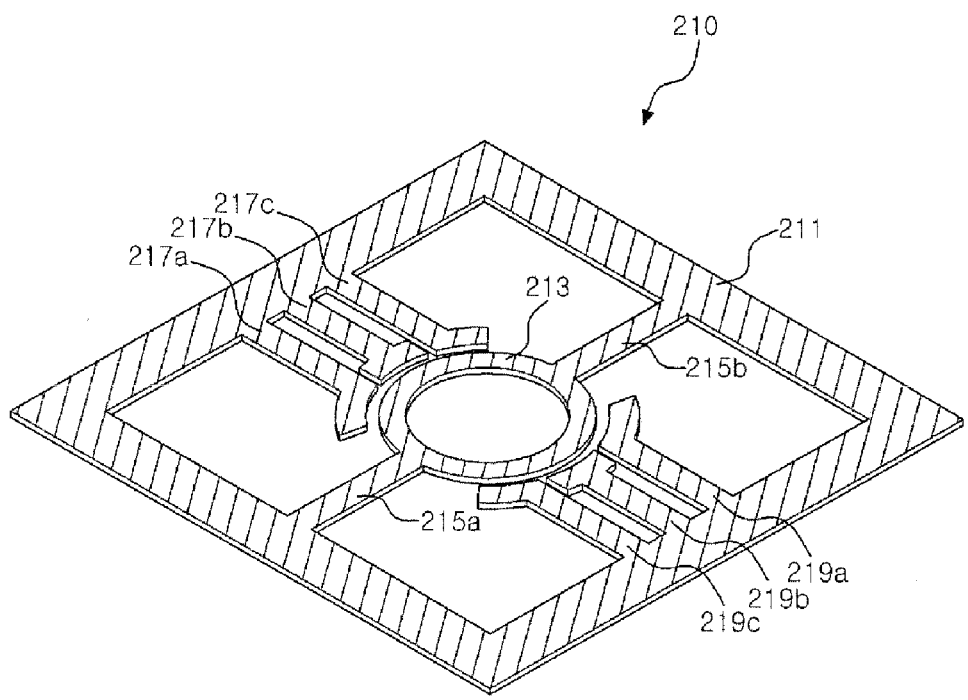

[Fig.14]
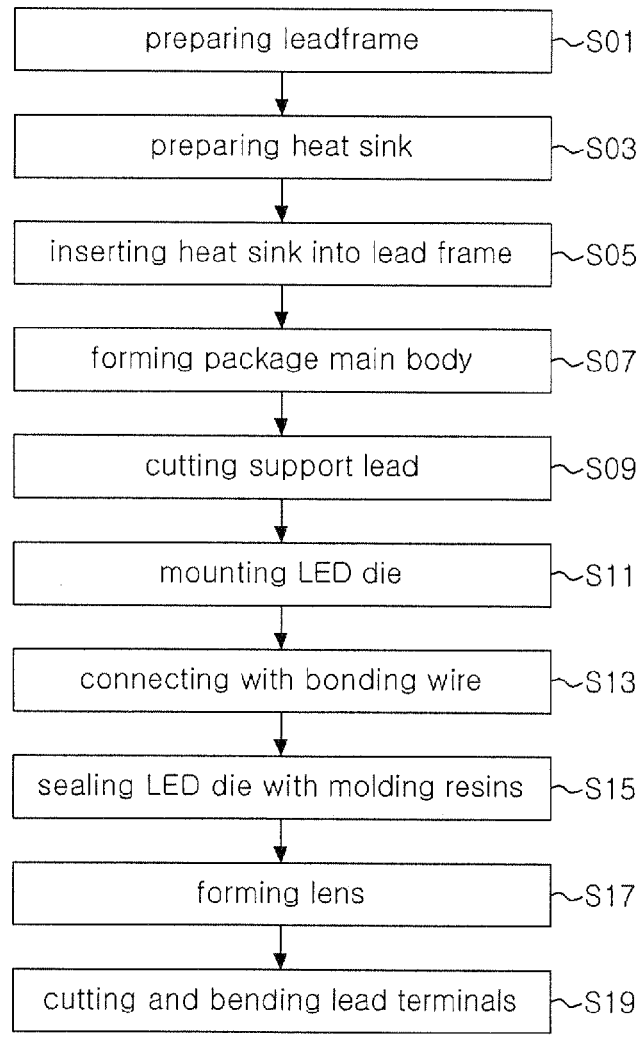
[Fig.15]
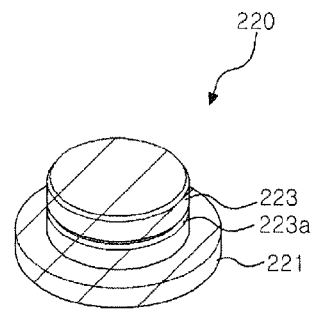

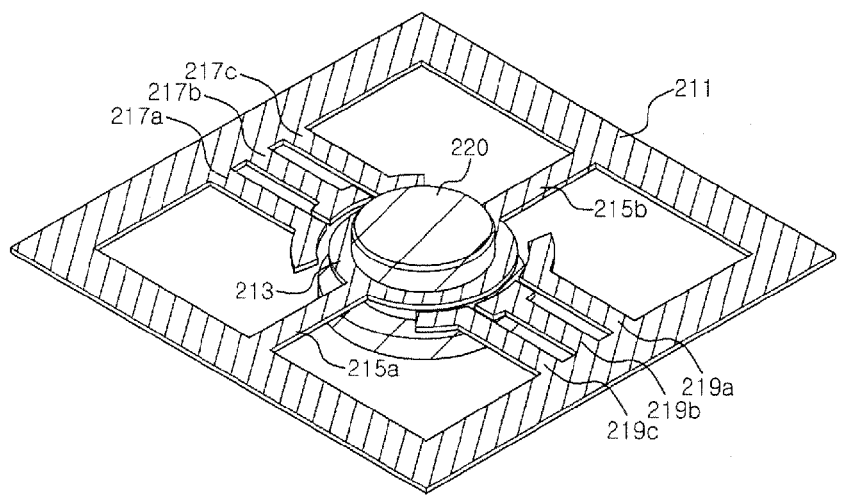
[Fig.16]
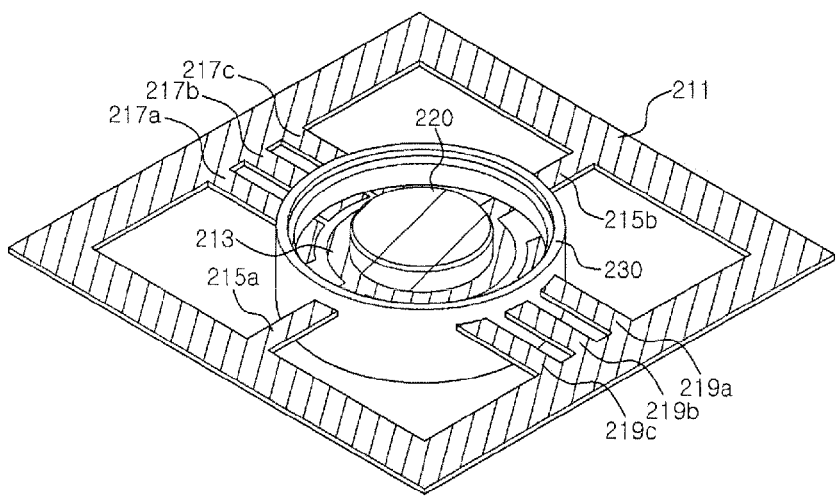
[Fig.17]

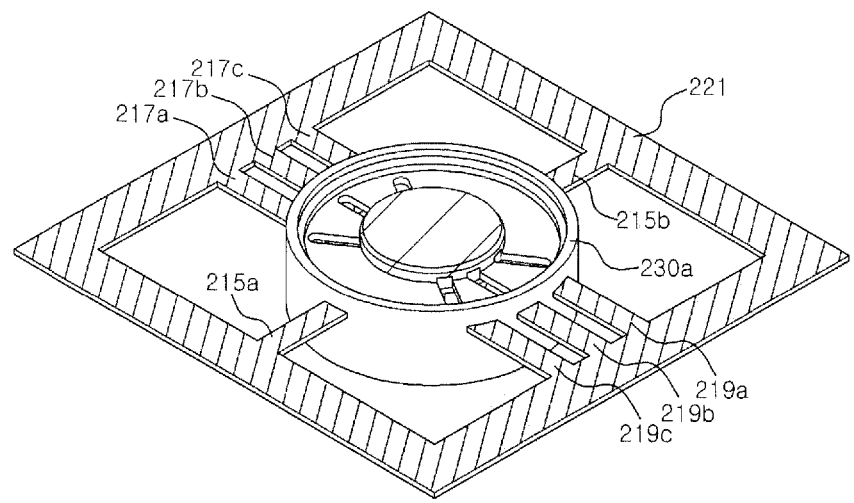
[Fig.18]
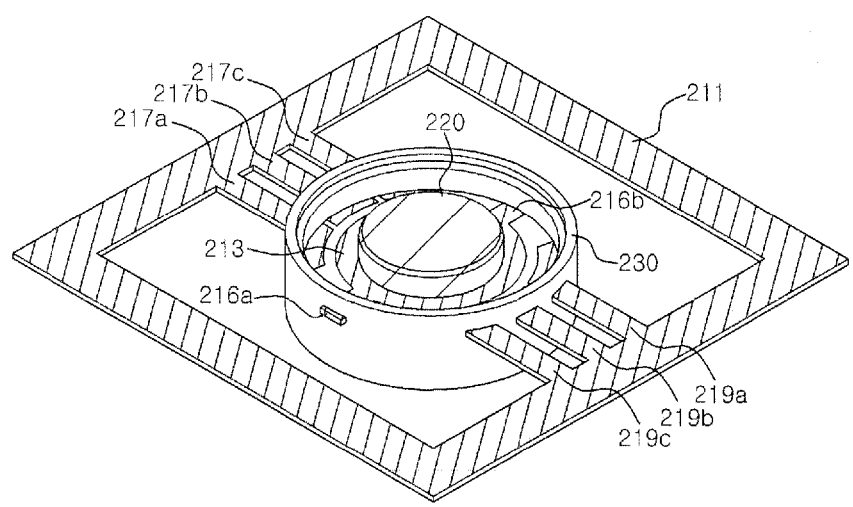
[Fig.19]

[Fig.20]
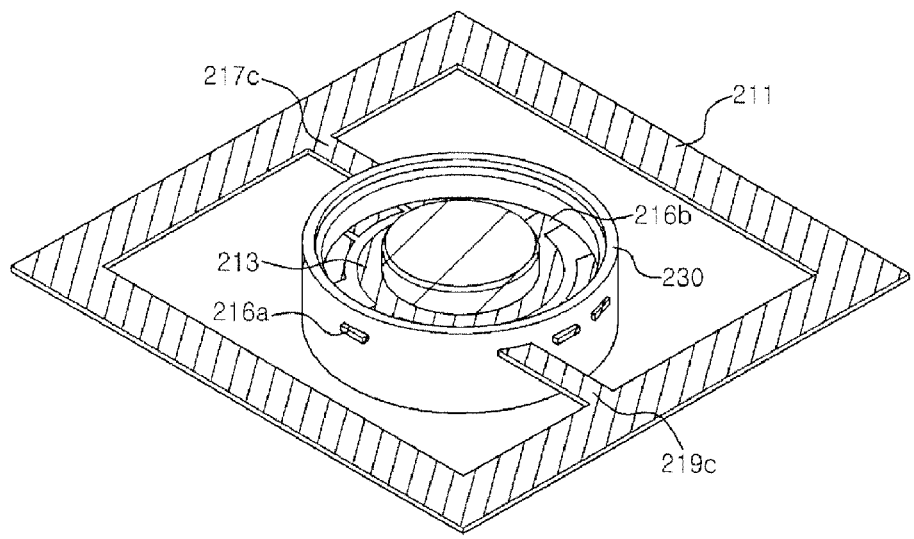
[Fig.21]
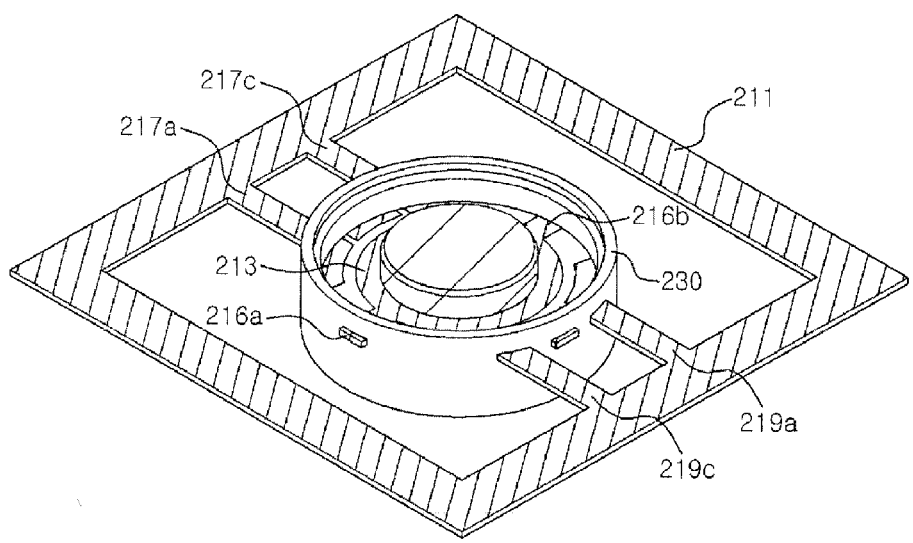

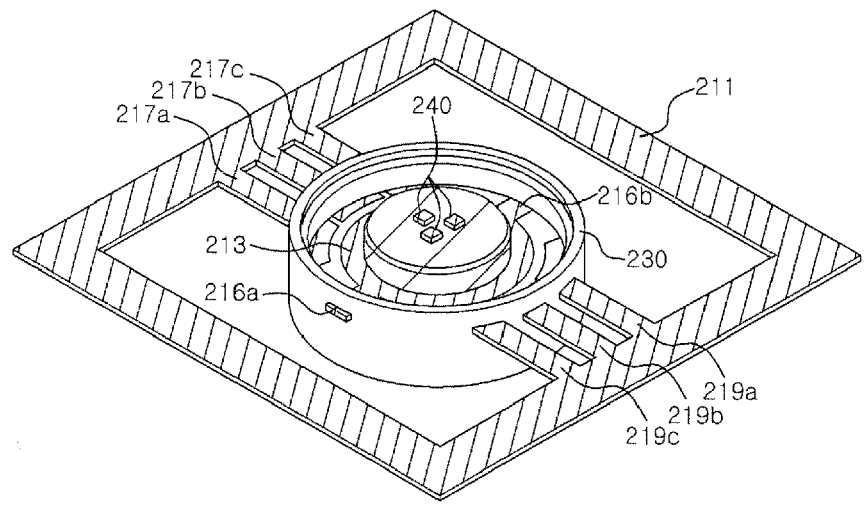
[Fig.22]
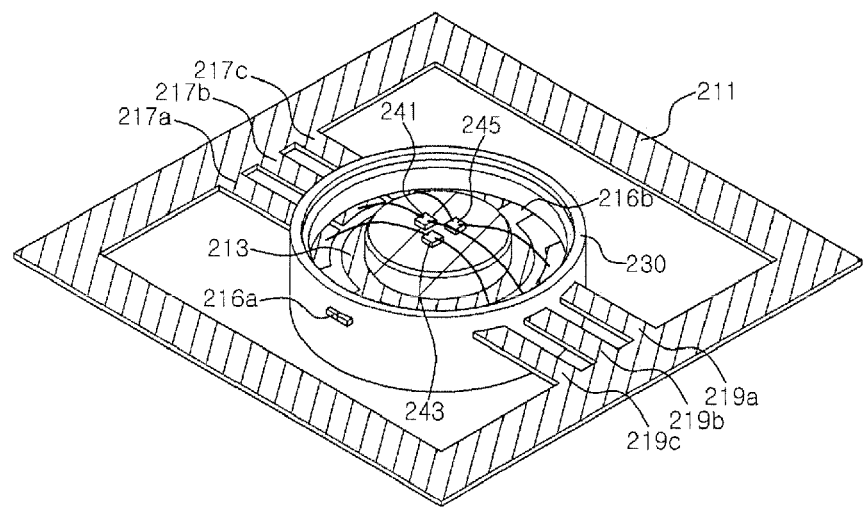
[Fig.23]

[Fig.24]
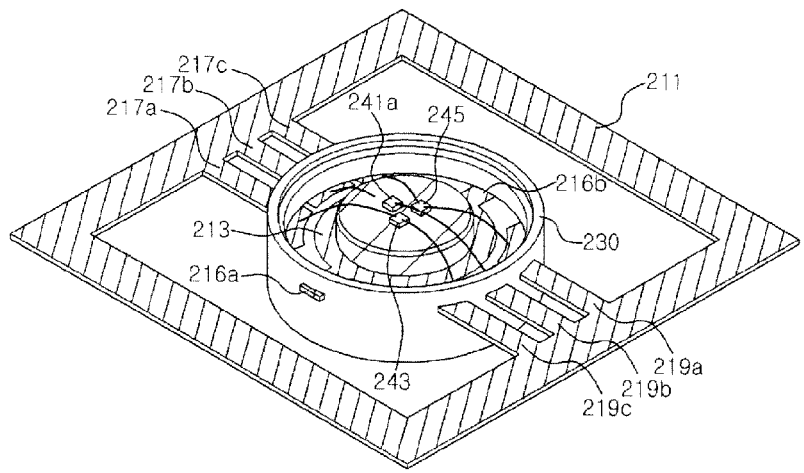
[Fig.25]
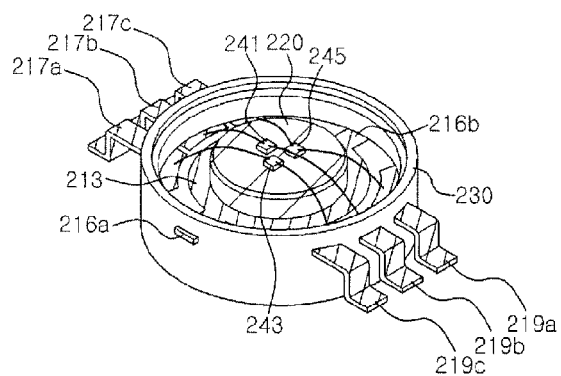
[Fig.26]
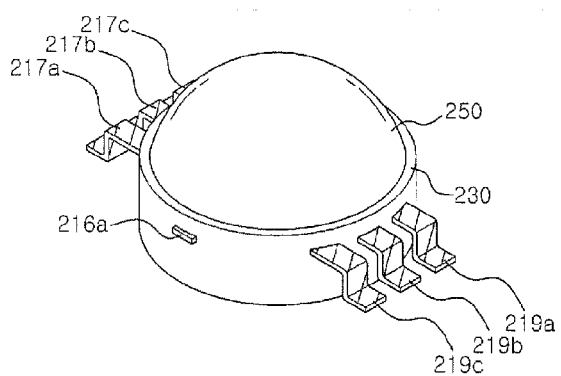

LIGHT EMITTING DIODE PACKAGE HAVING MULTIPLE MOLDING RESINS ON A LIGHT EMITTING DIODE DIE

CROSS-REFERENCE TO RELATED APPLICATION

This application is a U.S. national phase application of PCT International Application No. PCT/KR2005/001946, filed Jun. 23, 2005, which claims priority of Korean Patent Application Nos. 2004-0072452, filed Sep. 10, 2004, 2004-0079909, filed Oct. 7, 2004 and 2005-0000269, filed Jan. 3, 2005, the contents of which are incorporated herein by reference in their entirety.

TECHNICAL FIELD

The present invention relates to a light emitting diode package having a molding resin, and more particularly, to a light emitting diode package, in which a light emitting diode die is covered with a molding resin having lower hardness and then with another molding resin having higher hardness in order to alleviate stress imposed on the light emitting diode die and to prevent the deformation of a top surface of the molding resin.

BACKGROUND ART

In general, a light emitting diode (LED) package includes a molding resin for covering a mounted LED die. The molding resin protects the LED die from the external environment. That is, the molding resin protects the LED die and the bonding wire from the external force and prevents the damage of the LED die by blocking moisture from the atmosphere. In addition, the molding resin may contain a phosphor that can change the wavelength of light emitted from the LED die. As the result, a white light can be obtained using an LED die from which an ultraviolet or blue light is emitted.

Furthermore, the LED die generates heat when emitting light. The heat is transferred to the surroundings of the LED die. Thus, the molding resin covering the LED die undergoes a thermal cycle due to the repeated operation of the LED die. In a case where the molding resin has higher hardness, the molding resin may be cracked or peeled during the thermal cycle. In addition, the LED die may be broken or the bonding wire may be cut, due to thermal stress caused by a difference between thermal expansion coefficients of the molding resin and the LED die. The cracking and peeling of the molding resin lead to non-uniformity of the emitted light and deteriorates a moisture resistance characteristic. Moreover, in a case where the molding resin is formed of a thermoplastic resin, the residual stress after the curing is large, and thus, the aforementioned problem becomes worse.

An LED package capable of preventing the cracking and peeling of a molding resin due to a thermal cycle is disclosed in U.S. Pat. No. 6,747,293 (Nitta, et al.) entitled "Light emitting device." FIG. 1 is a sectional view showing an LED package 500 disclosed in the above '293 patent.

Referring to FIG. 1, the LED package 500 includes lead terminals 501 and 502 formed out of a lead frame and a main body 503 formed integrally with the lead terminals. The main body 503 is made of a thermoplastic resin. The lead terminals 501 and 502 are disposed in such a way that ends thereof face each other and the other ends thereof extend in opposite directions to project from the main body 503 to the outside.

In the meantime, the main body 503 has an opening 505 and an LED die 506 is mounted on a bottom surface of the opening 505. The LED die 506 may be attached on one lead terminal 501 using a conductive adhesive 507 and connected to the other lead terminal 502 through a bonding wire 509. The opening 505 has an inclined inner wall 504 such that light emitted from the LED die 506 can be reflected to the outside.

A scaling resin 511 is disposed within the opening 505 in such a manner as to cover the top of the LED die 506. The sealing resin 511 is a silicone resin having a relatively high hardness of 50 to 90 in JISA of Japanese Industrial Standards (JIS). A lens 513 is provided above the sealing resin 511 to collect light.

The sealing resin 511 of the LED package 500 has lower hardness than an epoxy resin having a hardness of 95 in JISA and thus the cracking or peeling of the sealing resin can be prevented. In addition, since the sealing resin 511 of the LED package 500 has a relatively higher hardness as compared with a silicone resin having a hardness of 30 to 40 in JISA, the external force has less influence on the LED die 506. However, since the sealing resin 511 of the LED package 500 has a relatively higher hardness as compared with the silicone resin, it causes a relatively larger amount of residual stress when cured. Further, relatively higher thermal stress is generated due to a thermal cycle. In particular, in a case where the size of the opening 505 or the input power increases, the above stress increases further, thereby reducing the reliability of the LED die 506 and causing the bonding wire 509 to be cut.

Meanwhile, the luminous power of an LED is substantially proportional to the input power. Therefore, high luminous power can be obtained by increasing the electric power input to the LED. However, the increase of the input power results in the increase of the junction temperature of the LED. The increase of the junction temperature of an LED causes the loss of photometric efficiency which represents the conversion rate of input energy into visible light. Therefore, it is required to prevent the junction temperature of the LED from rising due to the increased input power.

An example of an LED package that employs a heat sink to prevent the increase of the LED junction temperature is disclosed in U.S. Pat. No. 6,274,924B1, entitled "Surface mountable LED package." As described in the '924 patent, the LED die is thermally coupled on the heat sink and thus can be maintained to a lower junction temperature. Therefore, a relatively higher input power can be supplied to the LED die to obtain higher luminous power.

In this conventional LED package, however, the heat sink can be easily separated from the package main body, which results in structural instability. When the heat sink is separated from the package main body, bonding wires that electrically connect the LED die mounted onto the heat sink with the leads are cut off to bring an irreparable damage to the LED package. Thus, there is a need to provide an LED package in which the heat sink can be prevented from being separated from the package main body.

DISCLOSURE

Technical Problem

The present invention is conceived to solve the aforementioned problems in the art. An object of the present invention is to provide a light emitting diode package, in which a light emitting diode die can be protected from the surrounding environment such as external force and moisture, stress to be imposed on the light emitting diode die can be alleviated, and the deformation of a molding resin can be prevented during the process for sorting or assembling the LED package.

Another object of the invention is to provide a light emitting diode package, in which a heat sink is employed to smoothly dissipate heat generated from the light emitting diode die to the outside and can also be prevented from being separated from a package main body.

Technical Solution

According to an aspect of the present invention for solving the aforementioned technical problems, there is provided a light emitting diode package having multiple molding resins. The light emitting diode package includes a pair of lead terminals. At least portions of the pair of lead terminals are embedded in a package main body. The package main body has an opening through which the pair of lead terminals is exposed. A light emitting diode die is mounted in the opening and electrically connected to the pair of lead terminals. A first molding resin covers the light emitting diode die. Furthermore, a second molding resin with higher hardness than the first molding resin covers the first molding resin. Therefore, the first molding resin serves to alleviate stress to be imposed on the light emitting diode, and the second molding resin can be prevented from being deformed by external force.

The first molding resin may have a Durometer Shore value of less than 50 A and the second molding resin may have a Durometer Shore value of no less than 50 A.

The first and second molding resins may be formed of an epoxy or silicone resin. Further, at least one of the first and second molding resins may contain a phosphor. In addition, the first molding resin may be relatively thicker than the second molding resin. As a result, the stress imposed on the light emitting diode die below the first molding resin can be further reduced.

A heat sink may be coupled to the bottom of the package main body. The heat sink is partially exposed through the opening. The light emitting diode die is mounted on an exposed top surface of the heat sink. Therefore, heat generated from the light emitting diode die can be smoothly dissipated to the outside through the heat sink.

The heat sink may have a base and a protrusion projecting upward from a center portion of the base. Thus, since a heat dissipation surface can be increased without need to increase the size of the light emitting diode package, heat dissipation efficiency can be improved.

The heat sink may be formed with a latching step on at least one of sides of the base and/or the protrusion. The latching step is coupled to the package main body to prevent the heat sink from being separated from the package main body.

According to another aspect of the present invention, there is provided a light emitting diode package having multiple molding resins. The package includes a heat sink support ring. A heat sink is fitted into the support ring. At least two lead terminals are spaced apart from the support ring and heat sink, and disposed at opposite sides of the support ring. A package main body is molded with the heat sink and lead terminals to support the heat sink and lead terminals. The package main body has an opening through which the upper end of the heat sink and portions of the lead terminals are exposed. At least one light emitting diode die is mounted on a top surface of the heat sink. Bonding wires are used to electrically connect the light emitting diode die and the lead terminals with each other. A first molding resin covers the light emitting diode die, and a second molding resin covers the first molding resin. The second molding resin has higher hardness than the first molding resin. Thus, the first molding resin alleviates the stress to be imposed on the light emitting diode die, and the second molding resin is prevented from being deformed by external force. In addition, since the heat sink is fitted into and fixed to the support ring, the heat sink can be prevented from being separated from the package main body.

The first molding resin may have a Durometer Shore value of less than 50 A and the second molding resin may have a Durometer Shore value of no less than 50 A.

The first and second molding resins may be formed of an epoxy or silicone resin. Further, at least one of the first and second molding resins may contain a phosphor.

In addition, the first molding resin may be relatively thicker than the second molding resin. As a result, the stress to be imposed on the light emitting diode die below the first molding resin can be further reduced.

Meanwhile, the heat sink may have a base and a protrusion protruding upward from the center of the base, and the protrusion is inserted into the support ring.

The heat sink may be formed with a support ring receiving groove at a side of the protrusion. The support ring may be fastened in the receiving groove. Thus, the heat sink can be further prevented from being separated from the package main body.

DESCRIPTION OF DRAWINGS

FIG. 1 is a sectional view illustrating a conventional light emitting diode package.

FIG. 2 is a sectional view illustrating a light emitting diode package according to an embodiment of the present invention.

FIG. 3 is a sectional view illustrating a light emitting diode package according to another embodiment of the present invention.

FIGS. 4 to 12 illustrate a light emitting diode package employing a heat sink and a method of fabricating the same according to an embodiment of the present invention.

FIGS. 13 to 26 illustrate a light emitting diode package employing a heat sink and a method of fabricating the same according to another embodiment of the present invention.

MODE FOR CARRYING OUT THE INVENTION

Hereinafter, preferred embodiments of the invention will be described in detail with reference to the accompanying drawings.

FIG. 2 is a sectional view illustrating a light emitting diode package 10 according to an embodiment of the present invention.

Referring to FIG. 2, the light emitting diode (LED) package 10 includes a pair of lead terminals 11 and 13 formed out of a lead frame, and a package main body 15. The main body 15 may be formed of a thermoplastic resin or a thermosetting resin using an insert molding process. In general, for the purpose of mass production of the LED package 10, a plurality of package main bodies 15 are formed in a lead panel where a plurality of lead frames are arranged. After molding resin (23, 25 or 27) has been cured, the lead frames are cut into individual LED packages 10, and the lead terminals 11 and 13 are consequently formed. The lead terminals 11 and 13 are disposed in such a manner that ends thereof are close to face each other and the other ends thereof extend in opposite directions to protrude from the main body 15 to the outside.

At least portions of the lead terminals 11 and 13 are embedded in the package main body 15. That is, the main body 15 surrounds at least portions of the lead terminals 11 and 13 to fix the lead terminals thereto. In addition, the package main body 15 is provided with an opening 26 through which the lead terminals 11 and 13 are exposed to the outside. An inner wall 14 of the opening 26 may be inclined such that the light emitted from the LED die can be reflected to the outside.

An LED die 17 is mounted on a bottom surface of the opening 26. As illustrated in the figure, the LED die 17 may be attached on one lead terminal 11 using a conductive adhesive 19. The conductive adhesive may include a silver (Ag) epoxy. Furthermore, the LED die 17 may be connected to the other lead terminal 13 through a bonding wire 21. Accordingly, the LED die 17 is electrically connected with the lead terminals 11 and 13.

In the meantime, a first molding resin 23 covers the LED die 17. The first molding resin 23 may also cover the bonding wire 21. The first molding resin 23 has relatively lower hardness, i.e. a Durometer Shore value of preferably less than 50 A, and more preferably, no more than 10 A. The first molding resin 23 may be formed of an epoxy resin or a silicone resin. As illustrated in this figure, the first molding resin 23 may cover the LED die 17 and the bonding wire 21, and be bonded to the inner wall of the main body 15. Alternatively, the first molding resin 23 may cover the LED die 17 but not extend to the inner wall of the package main body 15. That is, the first molding resin may be limited to a certain region in the opening.

Furthermore, a second molding resin 25 covers the first molding resin 23. The second molding resin 25 is filled in the opening 26 and bonded to the inner wall 14 of the opening 26. A top surface of the second molding resin 25 may be flat or curved with a constant curvature. Preferably, the second molding resin 25 has relatively higher hardness than the first molding resin 23, i.e. a Durometer Shore value of at least 50 A. In addition, another molding resin (not shown) may be interposed between the first and second molding resins 23 and 25. The second molding resin 25 may be formed of an epoxy resin or a silicone resin. The second molding resin 25 and the another molding resin may be formed of the same material as the first molding resin 23. For example, in a case where the first molding resin 23 is a silicone resin, the second molding resin 25 is also a silicon resin. If the first and second molding resins 23 and 25 are made of the same material, the light loss due to reflection on the interface between the first and second molding resins can be reduced, and the adherence between the molding resins is increased to improve the moisture resistance characteristic. Further, the first molding resin 23 may be thicker than the second molding resin 25. Here, the thickness of the first and second molding resins 23 and 25 is defined by a value measured from the top surface of the LED die 17 in a vertical direction. Since the first molding resin 23 with lower hardness is thicker than the second molding resin 25, the stress to be imposed on the LED die 17 can be minimized. The first and second molding resins 23 and 25 may be formed either using a mold cup or dispenser or using a transfer molding process.

In addition, U.S. Pat. No. 6,274,924 has proposed an LED package for protecting an LED die using a molding resin with a Durometer Shore value of no more than 10 A. The package proposed in the '924 patent has an advantage in that thermal stress can be alleviated by using a molding resin having relatively lower hardness. However, the molding resin with low hardness may be easily deformed by means of external force.

In general, after the molding resin has been formed within the LED package, the lead frame is cut into individual separate packages, as described above. Then, the separated packages are sorted or assembled. At this time, the molding resin with lower hardness is likely to be deformed due to the external force. In particular, the deformation in the top surface of the molding resin hinders uniform emission of the light generated from the LED die.

On the other hand, in this embodiment of the present invention, the second molding resin 25 with relatively higher hardness covers the top of the first molding resin 23. Thus, the deformation in the top surface of the molding resin can be prevented. Further, since the first molding resin 23 with relatively lower hardness is interposed between the second molding resin 25 and the LED diode 17, thermal stress and residual stress in the molding resin can be alleviated. This stress alleviation results in the prevention of occurrence of cracking and peeling of the molding resins 23 and 25. Consequently, moisture penetration can be prevented, thereby improving reliability of the LED packages.

Furthermore, the first molding resin 23 and/or the second molding resin 25 may contain a phosphor. The phosphor can be used to change the wavelength of light emitted from the LED die. In addition, a lens 27 may be provided on the second molding resin 25. The lens 27 is used to allow the light emitted from the LED die 17 to be exited at a desired viewing angle. Alternatively, the second molding resin 25 may be manufactured in the form of a lens, for example, in a semicircular shape or Fresnel lens type.

FIG. 3 is a sectional view illustrating an LED package 50 according to another embodiment of the present invention.

Referring to FIG. 3, the LED package 50 includes a pair of lead terminals 51 and 53, a main body 55, an LED die 57, a conductive adhesive 59, a first molding resin 63, and a second molding resin 65, as described similarly with reference to FIG. 2. Similarly, the main body 55 has an opening 66 of which an inner wall 54 may be inclined.

Furthermore, the LED package 50 includes a heat transfer slug or heat sink 56 connected to a lower portion of the main body 55. As illustrated in this figure, the heat sink 56 is partially exposed through the opening 66, and the LED die 57 is mounted on a top surface of the exposed heat sink 56. The heat sink 56 may have a base and a protrusion projecting upward from a center portion of the base. The protrusion is exposed to the outside through the opening 66. Further, the heat sink 56 is configured in such a manner that the bottom surface thereof has a larger area than the exposed top surface in order to easily dissipate heat to the outside.

The LED die 57 is attached on the top surface of the heat sink 56 by means of the conductive adhesive 59. A bonding wire 62 connects the heat sink 56 to one lead terminal 51, and another bonding wire 61 connects the LED die 57 to the other lead terminal 53. As a result, the LED die 57 is electrically connected to the pair of the lead terminals 51 and 53.

In this embodiment, a heat sink 56 is used to easily dissipate heat generated from the LED die 57. Thus, the thermal stress due to a thermal cycle can be further reduced.

Hereinafter, another embodiment of an LED package employing a heat sink will be described in detail.

FIGS. 4 to 12 illustrate an LED package employing a heat sink and a method of fabricating the same according to an embodiment of the present invention, and FIGS. 13 to 26 illustrate an LED package employing a heat sink and a method of fabricating the same according to another embodiment of the present invention.

FIG. 4 is a plan view illustrating an LED lead panel used for the mass production of an LED package according to an embodiment of the present invention, FIG. 5 is an exploded perspective view illustrating the LED package according to the embodiment of the present invention, and FIG. 6 is a plan view illustrating a state where the LED package according to the embodiment of the present invention has been formed on the LED lead panel.

Referring to FIG. 4, an LED lead panel 101 used to fabricate an LED package of the present invention includes a plurality of lead frames arranged at regular intervals. The lead frame includes lead terminals 140 and connection frames 141 connecting the lead terminals 140 to each other. The connection frames 141 are paired to form a symmetrical structure and formed with a hollow section 144 having a predetermined shape at the center thereof.

In addition, the connection frame 141 is fixed to an outer frame through the lead terminals 140 and support leads 142. The outer frame is configured to surround the connection frames 141.

Although it has been described in this embodiment that the hollow section 144 formed at the center of the symmetrical connection frame 141 takes the shape of a hexagon, the present invention is not limited thereto. The hollow section 144 may take the shape of a circle or other polygons with at least four vertices.

Referring to FIG. 5, after the LED lead panel 101 has been formed, a package main body comprised of first and second housings 150 and 151 and a heat sink 153 are sequentially fixed to the LED lead panel 101.

That is, the first package housing 150 having a predetermined shape, such as a rectangular shape, is placed on the top of the pair of connection frames 141 which are integrally formed in the LED lead panel along with the lead terminals 140, and the second package housing 151 is placed on the bottom of the pair of connection frames 141.

The first package housing 150 is formed with a depressed portion at the center thereof in order to receive a molding resin. In a bottom of the first package housing 150 is formed a through-hole 158 through which the terminals and the hollow section 144 of the connection frames 141 are exposed. The through-hole 158 may have the same area as that of the depressed portion, and an area smaller than the depressed portion as shown in the figure. The depressed portion and the through-hole 158 are formed into an opening of the package main body. On an inner wall of the depressed portion is formed a stepped portion 159 where a molding resin of the LED package is accommodated, which will be described later.

On a top surface of the second package housing 151 is formed a receiving groove 152 having the same shape of the connection frame 141, and on a bottom surface of the second package housing 151 is formed a heat sink seating groove 157 into which a heat sink 153 is inserted and mounted.

In addition, the second package housing 151 is formed with a circular through-hole 155 at the center thereof to receive a protrusion 154 of the heat sink 153. The top surface of the protrusion 154 may be recessed, which in turn becomes an LED seating portion 156 where an LED chip 160 to be explained later is seated and fixed.

The first and second package housings 150 and 151 may be formed of a thermal conductive plastic material or a high thermal conductive ceramic material. Examples of the thermal conductive plastic material include ABS (Acrylonitrile Butadiene Styrene), LCP (Liquid Crystalline Polymer), PA (Polyamide), PPS (Polyphenylene Sulfide), TPE (Thermoplastic Elastomer) and so forth. Examples of the high thermal conductive ceramic material include $Al_2O_3$ (alumina), SiC (silicon carbide), AlN (aluminum nitride) and so forth. The aluminum nitride (AlN) has the same properties as the alumina ($Al_2O_3$) and is widely used because it is superior to the alumina in view of thermal conductivity.

In a case where the first and second package housings 150 and 151 are formed of a thermal conductive plastic material, the housings may be placed on the top and bottom of the symmetrical connection frames 141, respectively, and pressed at a higher temperature so that they are fixed to the LED lead panel 101. Here, the through-hole 158 and the stepped portion 159 may be formed by thermally pressing the package housing 150 using a pressing means that has a protrusion corresponding to the shape of the through-hole 158 and the stepped portion 159, after the first and second package housings 150 and 151 have been placed on the LED lead panel 101. Alternatively, the first and second package housings 150 and 151 may be integrally formed using an insert molding technique.

In a case where the first and second package housings 150 and 151 are formed of a ceramic material, the first and second package housings 150 and 151 should be beforehand manufactured to have accurate dimensions and shapes. Then, the first and second package housings 150 and 151 formed of the ceramic material are placed above and below the connection frames 141 of the LED lead panel 101 and then fixed to the LED lead panel 101 using a strong adhesive or the like.

Referring to FIG. 6, the LED package is formed in the lead frame which has been formed on the LED lead panel 101. Therefore, a plurality of LED packages are formed in the LED lead panel 101.

One or more LED dice 160 are mounted into the LED seating portion 156 located at the center of the heat sink 153 and electrically connected to the connection frames 141 through bonding wires 162.

In order to electrically protect the LED die 160 mounted into the LED seating portion 156, a Zener diode 161 may be mounted. This Zener diode 161 can maintain a constant voltage and thus protect the LED die 160 when static electricity or rapid high current is delivered, thereby improving the product reliability.

FIGS. 7 and 8 are perspective views of the LED package according to this embodiment as seen from above and below, respectively. FIG. 9 is a sectional view of an LED package employing a heat sink according to the present invention. FIGS. 10 to 12 are sectional views illustrating a molding resin and lens formed in the LED package.

A plurality of LED packages are formed on the LED lead panel 101, and each of the formed LED packages is cut from the LED lead panel 101 according to first and second package housings 150 and 151.

Referring to FIG. 7, the lead terminals 140 are cut to a desired length and bent at a desired angle such that they can be mounted on a PCB substrate (not shown).

Further, as shown in FIG. 8, the heat sink 153 is inserted from below the second package housing 151 and fixed to the package main body. At this time, the heat sink 153 may protrude downward beyond the bottom surface of the second package housing 151. Therefore, the surface of the downward protruding heat sink 153 can be brought into direct contact with the PCB substrate to thereby maximize a heat dissipation effect.

Referring to FIG. 9, in an inner space of the first package housing 150 are formed two stepped portions 159a and 159b. These stepped portions 159a and 159b function as a fixing step when forming a molding resin or lens to be explained later.

Furthermore, the heat sink 153 may be formed with a latching step 154a at the side of the protrusion 154 such that the latching step 154a can be inserted into and fixed to a depressed portion formed in the inner wall of the through-hole 155 of the second package housing 151. Therefore, the protrusion 154 of the heat sink 153 is fixed to the through-hole 155 of the second package housing 151 such that the heat sink 153 is prevented from being separated from the package main body. The latching step 154a may be formed on the base portion of the heat sink 153. The latching step 154a may be formed on the uppermost edge of the protrusion 154. At this time, the latching step 154a is coupled to the top surface of the second package housing 151 such that the heat sink 153 can be fixed to the package main body.

Referring to FIG. 10, in the inner space of the first package housing 150 is formed a first molding resin 165 which transmits light emitted from the LED die 160 while protecting the LED die 160 and the bonding wires 162.

The first molding resin 165 may be an epoxy resin or silicone resin and also contain a phosphor for converting light emitted from the LED die 160. Furthermore, the first molding resin 165 may contain a light diffuser for uniformly distributing the light.

Referring to FIG. 11, a second molding resin 167 covers the first molding resin 165. The second molding resin 167 is an epoxy resin or silicone resin having higher hardness than the first molding resin 165. The second molding resin 167 may contain a phosphor and/or light diffuser.

The first and second molding resins 165 and 167 may be formed in the inner space of the first package housing 150, using a mold cup or dispenser or using a transfer molding technique.

Referring to FIG. 12, a lens 166 is mounted on the top of the second molding resin 167. The lens 166 may be a convex lens for refracting the light, which has emitted from the LED die 160, within a certain range of viewing angle. The lens curvature varies according to the desired viewing angle. The lens 166 is fixed in the stepped portion 159b of the first package housing 150.

Hereinafter, another embodiment of an LED package according to the present invention will be described with reference to FIGS. 13 to 26.

FIG. 13 is a perspective view illustrating a lead frame 210 according to another embodiment of the present invention.

Referring to FIG. 13, the lead frame 210 is formed with a heat sink support ring 213 into which a heat sink can be inserted. As shown in this figure, the support ring 213 may take the shape of a circular ring, but the present invention is not limited thereto. The support ring 213 may take the shape of a polygonal ring.

In addition, an outer frame 211 surrounds the support ring 213. The outer frame 211 is spaced apart from the support ring 213. As shown in this figure, the outer frame 211 may be rectangular in shape, but the present invention is not limited thereto. The outer frame 211 may be circular or polygonal in shape.

The support ring 213 is connected with the outer frame 211 by means of at least two support leads 215a and 215b. The support leads 215a and 215b are positioned at opposite sides of the support ring 213 and connect the support ring 213 to the outer frame 211. In addition to the support leads 215a and 215b, additional support leads may be provided for connecting the support ring 213 and the outer frame 211 to each other.

Further, at least two lead terminals 217a to 217c and 219a to 219c extend from the outer frame 211 towards the support ring 213. However, these lead terminals are spaced apart from the support ring 213. As shown in this figure, each of the lead terminals 217a to 217c and 219a to 219c may be formed with a larger terminating portion at a position near the support ring 213. These lead terminals are preferably disposed near opposite sides of the support ring 213.

The desired number of lead terminals is determined depending on the type and the number of diodes to be mounted and the connection mode of bonding wires. However, it is preferred that the lead frame 210 have a number of the lead terminals such that it can be used in various cases. As shown in this figure, since the lead terminals 217a to 217c and 219a to 219c are disposed to be perpendicular to the support leads 215a and 215b, a number of the lead terminals can be disposed in the same direction.

Although six lead terminals 217a to 217c and 219a to 219c are illustrated in FIG. 13, fewer lead terminals may be disposed, or additional lead terminals may be disposed. The additional lead terminals can be disposed in the same direction as the support leads 215a and 215b.

The lead frame 210 according to this embodiment of the invention can be manufactured by pressing a plate of phosphorous bronze made of copper alloy with a die. Although only a single lead frame 210 is illustrated in FIG. 13, a plurality of lead frames 210 can be manufactured from and arranged on a single phosphorous bronze plate. In particular, for the purpose of mass production of the LED packages, a plurality of lead frames 210 manufactured from the single phosphorous bronze plate can be used.

FIG. 14 is a flowchart illustrating a process of fabricating an LED package according to an embodiment of the present invention. FIGS. 15 to 26 are perspective and plan views illustrating the method of fabricating the LED packages in accordance with the process of FIG. 14.

Referring to FIG. 14, the lead frame 210 of FIG. 13 is first prepared (S01). As described above, the lead frame 210 can be manufactured by pressing the phosphorous bronze plate. In addition, the plurality of lead frames 210 can be formed from and arranged on a single phosphorous bronze plate.

Referring to FIGS. 14 and 15, a heat sink 220, which can be inserted and fixed to the support ring 213 of the lead frame 210, is prepared. The heat sink 220 has a top surface on which an LED die can be mounted. Preferably, the size of the top surface of the heat sink 220 is smaller than the inner diameter of the support ring 213 such that the heat sink 220 can be easily inserted into the support ring 213, and the side of the heat sink 220 has an outer diameter larger than the inner diameter of the support ring 213.

Further, the heat sink 220 can be formed with a support ring receiving groove 223a in which the support ring 213 is inserted and coupled. Furthermore, the receiving groove 223a can be provided in a spiral form such that the support ring 213 can be easily fastened to the groove 223a.

The heat sink 220 may have a base 221 and a protrusion 223 that protrudes upward from a center portion of the base 221. Here, the receiving groove 223a is formed on the side of the protrusion 223. As shown in the figures, the base 221 and the protrusion 223 can be cylindrical, but the present invention is not limited thereto. The base and protrusion may take the shape of a polygonal casing. The protrusion 223 can be shaped similar to an inner shape of the support ring 213, but the present invention is not limited thereto. That is, the support ring 213 may take the shape of a circular ring whereas the protrusion 223 may take the shape of a rectangular casing.

The heat sink 220 can be formed of a metal with high thermal conductivity or a thermal conductive resin using a pressing or molding technique. In addition, the heat sink 220 is fabricated separately from the lead frame 210. Thus, step S01 of preparing the lead frame 210 and step S03 of preparing the heat sink 220 can be changed in order or performed at the same time.

Referring to FIGS. 14 and 16, the heat sink 220 is inserted into and fixed to the support ring 213 of the lead frame 210

(S05). Since the outer diameter of the side of the heat sink 220 is larger than the inner diameter of the support ring 213, the heat sink 220 may be forcibly inserted into and fixed to the support ring 213.

On the other hand, in a case where the support ring receiving groove 223a is formed, the support ring 213 is accepted into the receiving groove 223a to support the heat sink 220. At this time, a part of the support ring 213 is received in the receiving groove 223a and the remaining part thereof preferably protrudes outward from the protrusion 223. In addition, in a case where the receiving groove 223a is spiral, the heat sink 220 can be inserted into the support ring 213 by rotating the heat sink 220.

Referring to FIGS. 14 and 17, after the heat sink 220 has been fixed to the lead frame 210, a package main body 230 is formed using an insert molding technique (S07). The package main body 230 can be formed of a thermosetting or thermoplastic resin using an injection molding process.

The package main body 230 is formed around the heat sink 220 to support the support ring 213, the support leads 215a and 215b, the lead terminals 217a to 217c and 219a to 219c, and the heat sink 220. The support leads 215a and 215b and the lead terminals 217a to 217c and 219a to 219c partially protrude outward from the package main body 230. In addition, the package main body 230 has an opening through which an upper end of the heat sink 220 and the lead terminals 217a to 217c and 219a to 219c are exposed.

As shown in FIG. 17, portions of the support leads 215a and 215b and the support ring 213 can be exposed through the opening. Accordingly, a groove or recess is formed in the package main body 230a. Alternatively, as shown in FIG. 18, the package main body 230a may cover most portions of the heat sink 220, the support ring 213, the support leads 215a and 215b, and the lead terminals 217a to 217c and 219a to 219c except for the upper end of the heat sink, and portions of the lead terminals. To this end, several openings may be provided. Even in this case, a groove or recess surrounded by a side wall of the main body 230a may be also formed on the upper portion of the package main body 230a, as shown in the figure. In addition, the bottom surface of the heat sink 220 is exposed to the outside. Furthermore, the side surface of the base 221 can be exposed to the outside. In this way, the heat dissipation through the heat sink 220 can be promoted.

As shown in FIGS. 17 and 18, the package main body 230 or 230a can be shaped as a cylinder, but the present invention is not limited thereto. The main body 230 or 230a may be shaped as a polygonal casing such as a rectangular casing.

Since the heat sink 220 is coupled to the lead frame 210 and the package main body 230 is then formed of a thermosetting or thermoplastic resin using an injection molding process, the heat sink 220 can be strongly coupled to the package main body 230.

Referring to FIGS. 14 and 19, the support leads 215a and 215b protruding outward from the package main body 230 are cut and removed (S09). As a result, the cut support leads 216a and 216b remain in the package main body 230, and thus, the remaining support leads and the support ring 213 can further prevent the heat sink 220 from being separated from the package main body 230.

In the meantime, when cutting out the support leads 215a and 215b, the lead terminals 217a to 217c and 219a to 219c protruding outward from the package main body 230 can also be cut and removed, except lead terminals used for the supply of electric current. For example, as shown in FIG. 20, if only two lead terminals 217c and 219c are required, the other lead terminals 217a, 217b, 219a and 219b will be cut and removed. In addition, as shown in FIG. 21, if four lead terminals 217a, 217c, 219a and 219c are required, the other lead terminals 217b and 219b will be cut and removed.

The aforementioned step of cutting and removing the lead terminals 217a to 217c and 219a to 219c is performed only when the lead terminals prepared in the lead frame 210 are more than required in an LED package. Thus, when the number of lead terminals required in the LED package is the same as the number of lead terminals prepared in the lead frame 210, the above step of cutting and removing the lead terminals 217a to 217c and 219a to 219c need not be performed. In addition, even though extra lead terminals remain, they do not have influence on the operation of the LED package. Therefore, it is not necessarily to cut and remove the extra lead terminals.

Referring to FIGS. 14 and 22, an LED die 240 is mounted on the top surface of the heat sink 220 (S11). The LED die 240 may be a so-called one-bond die having electrodes on the upper and lower surfaces thereof or a so-called two-bond die having two electrodes on the upper surface thereof.

In a case where the LED die 240 is a one-bond die, the heat sink 220 is preferably formed of an electrical conductive metal. In this case, the LED die 240 is mounted on the heat sink 220 using an electrical conductive adhesive such as a silver epoxy. Alternatively, in a case where all the LED dice mounted on the heat sink 220 are two-bond dice, the heat sink 220 need not be electrically conductive. Further, the LED dice can be mounted on the heat sink 220 using a variety of thermal conductive adhesives in addition to a silver epoxy.

Meanwhile, a plurality of LED dice 240 can be mounted on the heat sink 220. In addition, the plurality of LED dice 240 can include a variety of LED dice that emit light of different wavelengths. For example, as shown in FIG. 22, three LED dice 240 can be mounted on the heat sink. At this time, the three LED dice 240 can emit red, green and blue light, respectively. Thus, the LED package can realize light of all colors by employing the three LED dice 240.

Referring to FIGS. 14 and 23, the LED dice 241, 243 and 245 are electrically connected to the lead terminals 217a to 217c and 219a to 219c, respectively, through the bonding wires (S13). In a case where the LED dice 241, 243 and 245 are all two-bond dice, each of the LED dice is connected to the two corresponding lead terminals through the two corresponding bonding wires. That is, as shown in the figure, the respective LED dice 241, 243 and 245 can be electrically connected to different pairs of the lead terminals, respectively. Alternatively, the respective LED dice are connected to one common lead terminal (for example, 217b) through the bonding wires, and also connected to the different lead terminals (for example, 219a, 219b and 219c) that are placed in opposition to the common lead terminal. In this case, the LED dice can be driven by means of different electric currents.

On the other hand, as shown in FIG. 24, a one-bond die 241a and two-bond dice 243 and 245 can be mounted together. At this time, one of the lead terminals 217b is electrically connected to the heat sink 220 through a bonding wire. Thus, the lead terminal 217b is electrically connected to a bottom surface of the one-bond die 241a through the bonding wire and the heat sink 220. Since a variety of combinations of one-bond dice and two-bond dice can be made, the bonding wire connection for each combination can also be performed in various modes.

In addition, the lead terminals and the LED dice can be connected to each other in various ways, and a plurality of LED dice can be connected to each other in parallel, series or series-parallel configurations.

After the LED dice 241, 243 and 245 and the lead terminals are connected through the bonding wires, the LED dice 241, 243 and 245 are sealed using first and second molding resins (not shown) (S15). The molding resins are filled in the opening of the package main body 230 to thereby seal the LED dice and the bonding wires.

In addition, the first and/or second molding resin can incorporate a phosphor. For example, the phosphor can be a phosphor that converts blue light into yellow, or green and red light. Thus, in a case where an LED die for emitting blue light is mounted on the heat sink 220, a portion of the light emitted from the LED die can be converted into yellow, or green and red light, so that an LED package for emitting white light to the outside can be provided. Furthermore, the molding resins may incorporate a diffuser. The diffuser distributes the light emitted from the LED dice such that the LED dice and the bonding wires can be prevented from being viewed from the outside and the light can be uniformly radiated to the outside.

After the LED dice are sealed by the molding resins, a lens 250 is formed on the top of the package main body 230 (S17) as shown in FIG. 26. The lens 250 is used to emit light within a certain viewing angle and may be omitted if a lens need not be employed. In particular, the second molding resin may be cured in the form of a lens to function as a lens. At this time, the step of forming a lens can be omitted.

Referring to FIGS. 14 and 25, the lead terminals 217a to 217c and 219a to 219c are cut and bent from the outer frame 211 (S19). Finally, a surface mountable LED package is completed. Meanwhile, step S09 of cutting and removing the support leads may be performed together in step S19.

Hereinafter, the LED package according to this embodiment will be described in detail with reference to FIG. 25.

Referring again to FIG. 25, the LED package includes the heat sink support ring 213. The support ring 213 is formed of a copper alloy such as phosphorous bronze. As shown in the figure, the support ring 213 can be shaped as a circular ring, but the present invention is not limited thereto. The support ring may be shaped as a polygonal ring. The cut support leads 216a and 216b are extended outward from the support ring 213. The cut support leads 216a and 216b may be disposed at opposite sides of the support ring 213.

The heat sink 220, which was described in connection with FIG. 15, is inserted into the support ring 213. Meanwhile, at least two lead terminals 217a to 217c and 219a to 219c are disposed at both sides of the support ring 213 and are spaced apart from the support ring 213 and the heat sink 220. The lead terminals 217a to 217c and 219a to 219c may be bent to be surface-mounted.

Furthermore, the package main body 230 is molded to support the heat sink 220 and the lead terminals 217a to 217c and 219a to 219c. The package main body 230 has an opening at the upper portion thereof, through which the upper end of the heat sink 220 and parts of the lead terminals 217a to 217c and 219a to 219c are exposed.

Meanwhile, the lead terminals 217a to 217c and 219a to 219c penetrate through the side wall of the package main body 230 and protrude outward from the side wall of the main body 230.

As explained with reference to FIG. 17, portions of the support leads 215a and 215b and the support ring 213 may be exposed through the opening. Thus, a groove or recess is formed in the package main body 230. In addition, as explained with reference to FIG. 18, the package main body 230a may cover most of the heat sink, the support ring, the support leads and the lead terminals except for the upper end of the heat sink and portions of the lead terminals. Thus, several openings may be formed. Even in this case, the package main body 230a is preferably formed with a groove or recess surrounded by the side wall of the package main body, as shown in FIG. 18. The package main body 230 may be a plastic resin formed by an injection molding of a thermoplastic resin after the heat sink 220 is inserted into and fixed to the support ring 213.

In addition, the LED dice 241, 243 and 245 are mounted on the top surface of the heat sink 220. Although the LED dice shown in FIG. 25 are illustrated as two-bond dice, the present invention is not limited thereto. For example, the LED dice may be either one-bond dice or the combination of one-bond dice and two-bond dice.

The LED dice are electrically connected to the lead terminals 217a to 217c and 219a to 219c through bonding wires. In a case where the LED dice are two-bond dice, each of the LED dice is electrically connected to two lead terminals through two bonding wires. Alternatively, in a case where at least one of the LED dice is a one-bond die, the heat sink 220 is electrically connected to at least one of the lead terminals 217a to 217c and 219a to 219c through the bonding wire.

The LED dice may be connected with the lead terminals in various ways according to the required characteristics of the LED package.

In the meantime, the first and second sealing resins (not shown) cover and seal the LED dice. The grooves formed on the upper portion of the package main body 230 are filled with the sealing resins. In addition, the sealing resins may contain a phosphor and/or a diffuser. As shown in FIG. 26, the lens 250 maybe further formed in the package main body 230. Alternatively, the second sealing resin may be formed in the shape of a lens to thereby function as a lens.

According to the present invention, there is provided an LED package, in which LED dice can be protected from surrounding environments such as external force and moisture, the stress to be imposed on the LED dice can be alleviated, and the deformation of the molding resin can be prevented during the sorting and assembly. Further, the present invention can provide an LED package, in which a heat sink is employed to smoothly dissipate heat generated from the LED dice, and the heat sink cannot be separated from the package main body.

The invention claimed is:

1. A light emitting diode package having multiple molding resins, comprising:
   at least a pair of lead terminals;
   a package main body having an opening exposing the pair of lead terminals, the package main body embedding at least a portion of the pair of lead terminals;
   a light emitting diode die mounted in the opening and electrically connected to the pair of lead terminals;
   a heat sink coupled to the bottom of the package main body and partially exposed through the opening, wherein the light emitting diode die is mounted on a top surface of the heat sink;
   a first molding resin covering the light emitting diode die; and
   a second molding resin having higher hardness than the first molding resin and completely covering the first molding resin without a gap between the first molding resin and the second molding resin,
   wherein the pair of lead terminals are disposed on a bottom of the opening, and wherein the package main body comprises an inner wall defining the opening, the inner wall comprising a stepped portion extending from an exposed upper surface of the exposed lead terminals.

2. The light emitting diode package as claimed in claim 1, wherein the first molding resin has a Durometer Shore value of less than 50 A and the second molding resin has a Durometer Shore value of no less than 50 A.

3. The light emitting diode package as claimed in claim 2, wherein the first and second molding resins are formed of an epoxy or silicone resin.

4. The light emitting diode package as claimed in claim 3, wherein the second molding resin is formed in the shape of a lens.

5. The light emitting diode package as claimed in claim 3, wherein the first and/or second molding resin contains a phosphor.

6. The light emitting diode package as claimed in claim 2, wherein the first molding resin and the second molding resin are made of the same material.

7. The light emitting diode package as claimed in claim 6, wherein the first molding resin is thicker than the second molding resin.

8. The light emitting diode package as claimed in claim 7, wherein the first molding resin, the second molding resin, or both the first molding resin and the second molding resin contain a phosphor.

9. The light emitting diode package as claimed in claim 1, wherein the heat sink has a base and a protrusion projecting upward from the center portion of the base.

10. The light emitting diode package as claimed in claim 9, wherein the heat sink is formed with a latching step on at least one of sides of the base and/or the protrusion.

11. The light emitting diode package as claimed in claim 1, wherein the inner wall extends higher than a top surface of the light emitting diode die, and the second molding resin is bonded to the inner wall.

12. The light emitting diode package as claimed in claim 11, wherein the first molding resin is bonded to the inner wall.

13. The light emitting diode package as claimed in claim 12, wherein the first molding resin, the second molding resin, or both the first molding resin and the second molding resin contain a phosphor.

14. The light emitting diode package as claimed in claim 12, wherein the first molding resin extends to be bonded to the inner wall below the stepped portion, and the second molding resin extends to be bonded to the inner wall including the stepped portion.

15. The light emitting diode package as claimed in claim 14, wherein the first molding resin extends to be bonded to the inner wall below the stepped portion such that an upper surface of the first molding resin is coplanar with the stepped portion, and a lower surface of the second molding resin is formed directly on the stepped portion.

16. The light emitting diode package as claimed in claim 12, wherein the light emitting diode die is located below the stepped portion.

17. The light emitting diode package as claimed in claim 1, the inner wall extends higher than a top surface of the light emitting diode die, the inner wall comprising a first stepped portion and a second stepped portion over the exposed lead terminals, the opening being wider at the second stepped portion than at the first stepped portion.

18. The light emitting diode package as claimed in claim 17, wherein the first molding resin is bonded to the inner wall below the first stepped portion, and the second molding resin is bonded to the inner wall below the second stepped portion.

19. The light emitting diode package as claimed in claim 18, wherein the first molding resin, the second molding resin, or both the first molding resin and the second molding resin contain a phosphor.

* * * * *